(12) United States Patent
Otake (10) Patent No.: US 8,174,244 B2
(45) Date of Patent: May 8, 2012

(54) CHARGING DEVICE AND CHARGING SYSTEM

(75) Inventor: Shinichi Otake, Nukata-gun (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 283 days.

(21) Appl. No.: 12/450,299

(22) PCT Filed: Jun. 10, 2008

(86) PCT No.: PCT/JP2008/060937
§ 371 (c)(1),
(2), (4) Date: Sep. 21, 2009

(87) PCT Pub. No.: WO2008/153173
PCT Pub. Date: Dec. 18, 2008

(65) Prior Publication Data
US 2010/0033140 A1 Feb. 11, 2010

(30) Foreign Application Priority Data
Jun. 15, 2007 (JP) ................................. 2007-158723

(51) Int. Cl.
*H01M 10/46* (2006.01)
(52) U.S. Cl. ........................................................ 320/165
(58) Field of Classification Search .................. 320/107, 320/128, 137, 162, 166
See application file for complete search history.

(56) References Cited

U.S. PATENT DOCUMENTS

| 6,351,366 B1 * | 2/2002 | Alexanian et al. | 361/189 |
| 2002/0085333 A1 * | 7/2002 | Alexanian et al. | 361/189 |
| 2005/0286184 A1 * | 12/2005 | Campolo | 361/42 |
| 2006/0071618 A1 | 4/2006 | Yudahira et al. | |
| 2006/0267676 A1 * | 11/2006 | Mizuno et al. | 327/546 |

FOREIGN PATENT DOCUMENTS

| JP | A-7123599 | 5/1995 |
| JP | A-8-88908 | 4/1996 |
| JP | A-11-205909 | 7/1999 |
| JP | A-2000-106077 | 4/2000 |
| JP | A-2000-270463 | 9/2000 |
| JP | A-2000-354332 | 12/2000 |
| JP | A-2006-121844 | 5/2006 |
| JP | A-2006-129691 | 5/2006 |

OTHER PUBLICATIONS

Office Action issued in Japanese Application No. 2007-158723 dated Feb. 8, 2011 (with translation).
Japanese Decision to Grant Patent dated Nov. 22, 2011 issued in Japanese Application No. 2007-158723 (with translation).

* cited by examiner

*Primary Examiner* — Edward Tso
(74) *Attorney, Agent, or Firm* — Oliff & Berridge, PLC (57) ABSTRACT

A test circuit first detects whether or not a relay unit is normal, and then examines an operation of leakage detecting circuit. This allows relay unit to interrupt an electric power supply path including power lines more securely if electrical leakage occurs in the electric power supply path. If welding in the contact of the relay unit is detected before starting charging of a power storage device included in an electrical device, a control device does not allow the charging of the power storage device, which can prevent a problem from occurring in the electrical device.

4 Claims, 5 Drawing Sheets

CHARGING DEVICE AND CHARGING SYSTEM

TECHNICAL FIELD

The present invention relates to a charging device and a charging system, particularly, a technique enabling a smooth operation in charging a battery of an electric vehicle using an external electric power source.

BACKGROUND ART

Japanese Patent Laying-Open No. 2000-354332 discloses a charging device for an electric vehicle. This charging device includes a relay for opening and closing an electric power supply path from an external electric power source to an electric vehicle; a leakage detecting circuit for detecting electrical leakage based on current flowing through the electric power supply path; a test circuit for intentionally causing electrical leakage at the start of supplying electric power from the external electric power source to an electric power supply circuit; a control circuit for controlling the relay so that the electric power supply path is brought into an open state, when the leakage detecting circuit detects electrical leakage. Prior to charging, the control circuit checks an operation of the leakage detecting circuit.

In the charging device disclosed in Japanese Patent Laying-Open No. 2000-354332, the control device turns on the relay to check the operation of the leakage detecting circuit. However, if the relay has a welded contact, the control circuit cannot cause the electric power supply path to be interrupted after the checking of the operation of the leakage detecting circuit. In this case, the electrical leakage is likely to remain. It is considered that this makes it impossible to perform a charging operation smoothly using the foregoing charging device. Japanese Patent Laying-Open No. 2000-354332 does not disclose an operation of the control circuit when the welding of the relay occurs.

DISCLOSURE OF THE INVENTION

It is an object of the present invention to provide a charging device enabling a charging operation to be performed smoothly onto an electrical device, and a charging system including the charging device.

In summary, the present invention provides a charging device provided between a chargeable electrical device and an electric power source for supplying charging electric power to the electrical device. The charging device includes: an electric power supply path for supplying the charging electric power from the electric power source to the electrical device; an interrupting circuit configured to be operable to interrupt the electric power supply path; a leakage detecting circuit for detecting electrical leakage occurring in the electric power supply path; and an examining circuit for detecting the interruption of the electric power supply path caused by the interrupting circuit and for examining the leakage detecting circuit after confirming the interruption of the electric power supply path caused by the interrupting circuit.

According to another aspect of the present invention, a charging system includes: an electrical device including a chargeable power storage device; and a charging device for charging the power storage device by supplying charging electric power from an electric power source to the power storage device. The charging device includes: an electric power supply path for supplying the charging electric power from the electric power source to the electrical device; an interrupting circuit configured to be operable to interrupt the electric power supply path; a leakage detecting circuit for detecting electrical leakage occurring in the electric power supply path; and an examining circuit for detecting the interruption of the electric power supply path caused by the interrupting circuit and for examining the leakage detecting circuit after confirming the interruption of the electric power supply path caused by the interrupting circuit.

Preferably, the charging device further includes a first control circuit for causing the interrupting circuit to interrupt the electric power supply path during a non-charging period of the power storage device. The interrupting circuit is operable to end the interruption of the electric power supply path. The electrical device further includes: a connecting circuit for electrically connecting and disconnecting the power storage device to and from the electric power supply path; and a second control circuit for setting the connecting circuit at a disconnection state during the non-charging period of the power storage device, and for causing the interrupting circuit to end the interruption of the electric power supply path and setting the connecting circuit at a connection state, during a charging period of the power storage device in a case where the second control circuit determines that the electric power supply path has a voltage indicating a voltage obtained when the electric power supply path is interrupted.

More preferably, the electrical device is installed in a vehicle and outputs motive power of the vehicle.

Thus, according to the present invention, a charging operation can be performed onto the electrical device smoothly.

BEST MODES FOR CARRYING OUT THE INVENTION

The following explains an embodiment of the present invention in detail with reference to figures. Note that the same and equivalent parts in the figures are given the same reference characters, and explanation therefor is not repeated.

Figure 1:
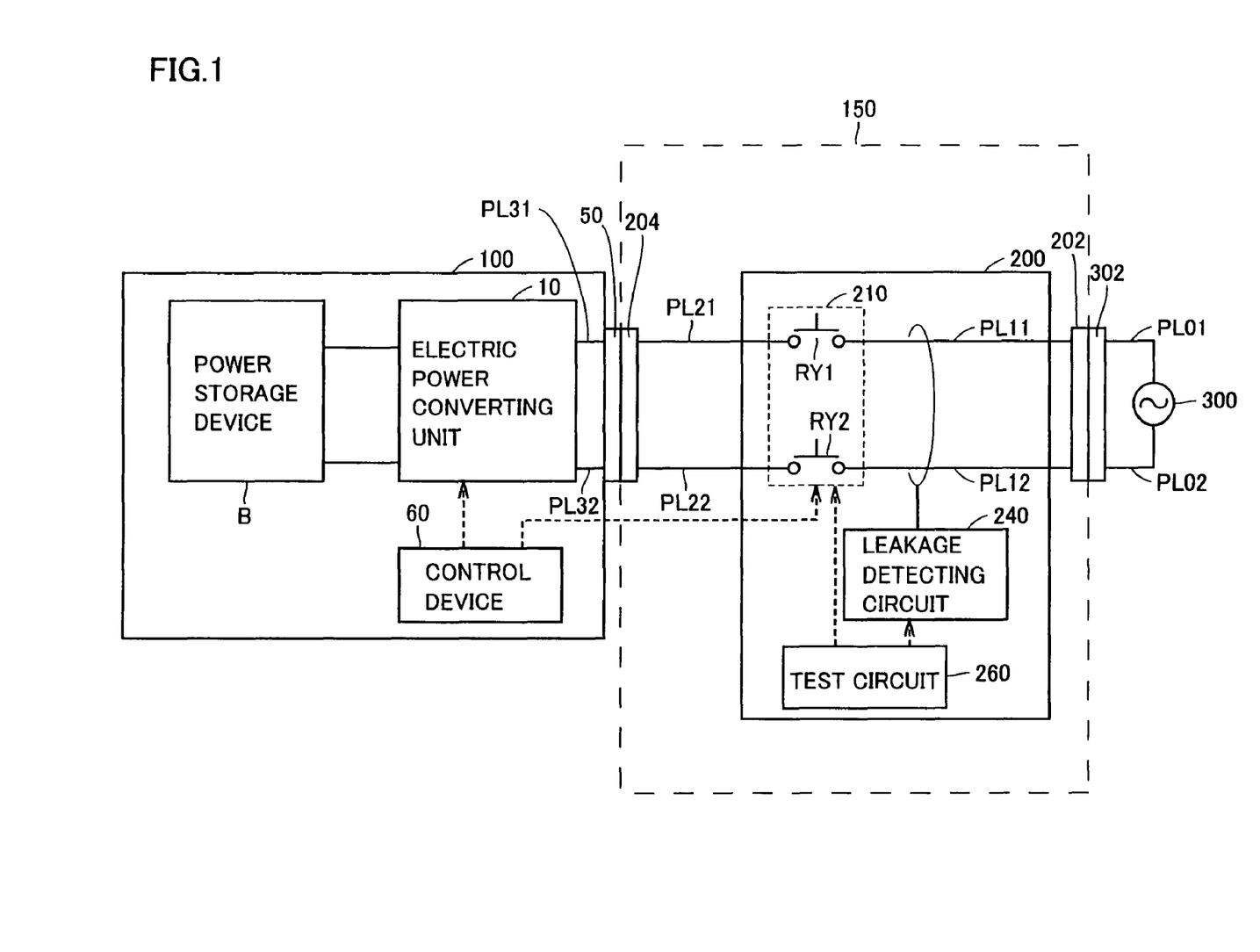
FIG. 1 illustrates a charging device and a charging system according to an embodiment of the present invention.

FIG. 1 illustrates a charging device and a charging system according to the embodiment of the present invention. Referring to FIG. 1, the charging system according to the embodiment of the present invention includes an electrical device 100 configured to be chargeable, and a charging device 150. Charging device 150 is provided between electrical device 100 and an alternate current (ac) electric power source 300 for charging electrical device 100.

Electrical device 100 includes an electric power converting unit 10, a power storage device B, a control device 60, and power lines PL31, PL32. Charging device 150 includes connectors 202, 204, power lines PL11, PL12, PL21, PL22, and a charge control device 200.

Ac electric power source 300 supplies an ac electric power of, for example, 100V (or 200V)/15 A. To ac electric power source 300, a connector 302 is connected via power lines PL01, PL02.

By connecting connector 202 to connector 302, power line PL11 is connected to power line PL01 and power line PL12 is connected to power line PL02. For example, connector 202 is a plug while connector 302 is a socket.

By connecting connector 204 to connector 50, power line PL21 is connected to power line PL31 and power line PL22 is connected to power line PL32.

Charge control device 200 includes a relay unit 210 (interrupting circuit), a leakage detecting circuit 240, and a test circuit 260. Relay unit 210 includes relays. RY1, RY2.

Relays RY1, RY2 are simultaneously opened or closed under control of test circuit 260 or control device 60. Hereinafter, turning-on (off) of relays RY1, RY2 is referred to as "turning-on (off) of relay unit 210". When relay unit 210 is turned on, relay RY1 connects power line PL11 to power line PL21, and relay RY2 connects power line PL12 to power line PL22. In this operation, power lines PL11, PL21, PL12, PL22 constitute an electric power supply path for supplying ac electric power from ac electric power source 300 to electrical device 100. When relay unit 210 is turned off (relays RY1, RY2 are turned off), the electric power supply path is interrupted. Specifically, when turned off, relay unit 210 interrupts the electric power supply path, whereas when turned on, relay unit 210 is operable to end the interruption of the electric power supply path.

Leakage detecting circuit 240 detects electrical leakage occurring in the electric power supply path. Test circuit 260 examines the interruption of the electric power supply path caused by relay unit 210. After confirming the interruption of the electric power supply path caused by relay unit 210, test circuit 260 intentionally causes electrical leakage in the electric power supply path and examines leakage detecting circuit 240. This allows relay unit 210 to interrupt the electric power supply path more securely if electrical leakage occurs during charging of electrical device 100. In this way, according to the present embodiment, a user's charging operation can be performed smoothly.

Next, electrical device 100 will be explained. Electric power converting unit 10 converts the ac electric power received from ac electric power source 300 via the electric power supply path, into direct current (dc) electric power. Power storage device B receives the dc electric power from electric power converting unit 10 and is charged accordingly. While power storage device B is being charged, control device 60 brings relay unit 210 into the on state and controls the operation of electric power converting unit 10. However, when control unit 60 detects that ac voltage has been fed to electric power supply path before turning on relay unit 210, control unit 60 determines that the contact of the relay is welded. In this case control device 60 does not allow electric power converting unit 10 to operate. This can prevent a problem from occurring in power storage device B or electric power converting unit 10. By thus preventing a problem from occurring in power storage device B or electric power converting unit 10, it is also possible to prevent influence over the user's charging operation. In this way, according to the present embodiment, the user's charging operation can be performed smoothly.

Now, specific configurations of electrical device 100 and charge control device 200 will be described.

Figure 2:
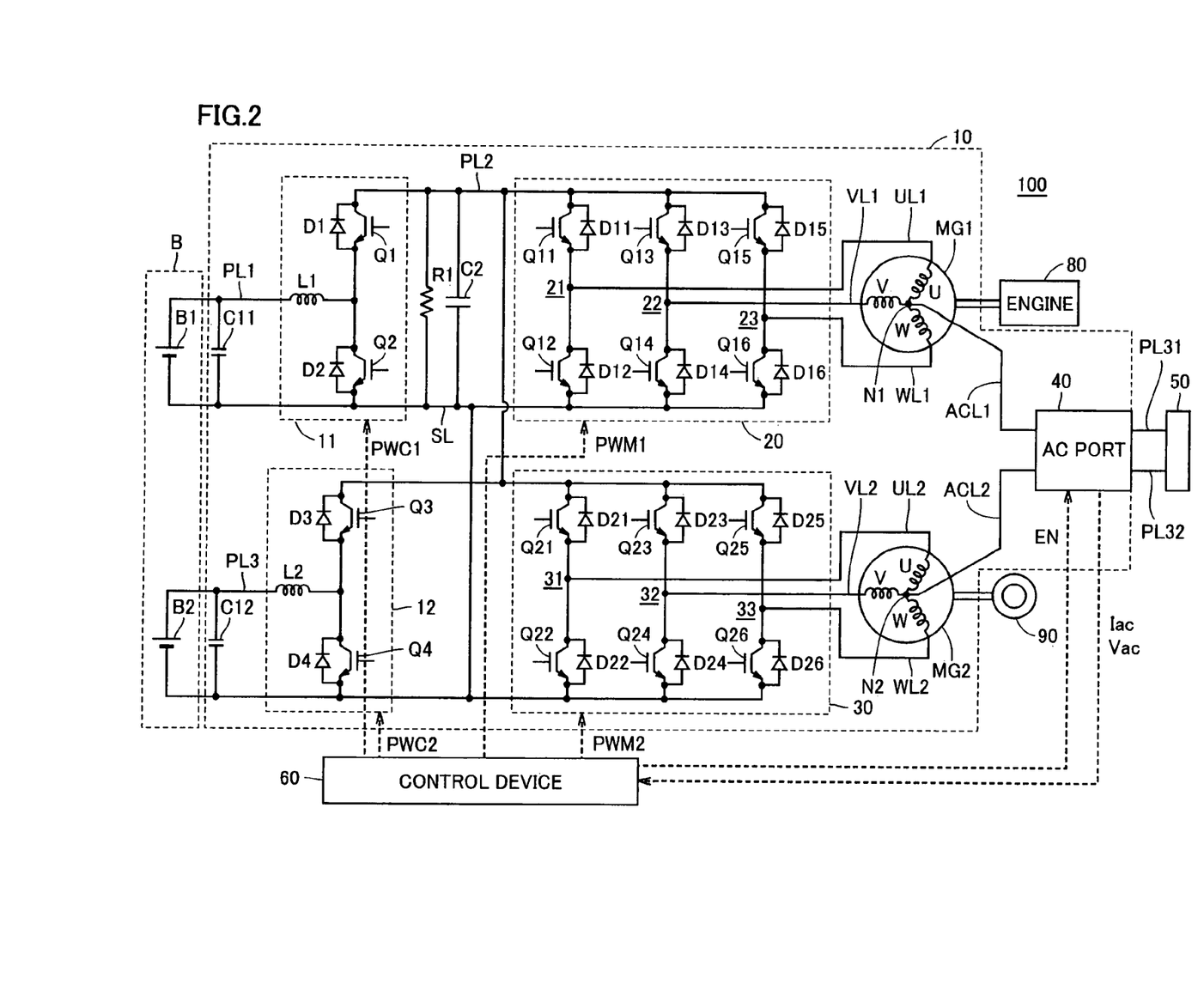
FIG. 2 illustrates an exemplary configuration of an electrical device 100 of FIG. 1.

FIG. 2 illustrates an exemplary configuration of electrical device 100 of FIG. 1. Referring to FIG. 2, electrical device 100 includes power storage device B, electric power converting unit 10, and control device 60. Electric power converting unit 10 includes boosting converters 11, 12, inverters 20, 30, motor generators MG1, MG2, an AC port 40, capacitors C11, C12, C2, a resistor R1, power lines PL1-PL3, a ground line SL, U phase lines UL11, UL2, V phase lines VL1, VL2, W phase lines WL1, WL2, and AC lines ACL1, ACL2.

Electrical device 100 is installed in, for example, a hybrid vehicle, and is incorporated thereinto as a motive power output device for outputting motive power of the vehicle. Motor generator MG1 operates as a generator driven by an engine 80 and is incorporated into the hybrid vehicle to operate as a motor capable of starting the engine. Motor generator MG2 is incorporated into the hybrid vehicle as a motor for driving a driving wheel 90 of the hybrid vehicle.

Each of motor generators MG1, MG2 is constituted by, for example, a three-phase alternating current synchronous motor. Motor generator MG1 generates ac voltage using torque given from engine 80, and outputs the generated ac voltage to inverter 20. Also, motor generator MG1 receives ac voltage from inverter 20 and uses it to generate driving power to start engine 80. Motor generator MG2 receives ac voltage from inverter 30 and uses it to generate driving torque of the vehicle. Also, motor generator MG2 generates ac voltage upon regenerative braking, and outputs it to inverter 30.

Power storage device B includes batteries B1, B2 each of which can be charged and discharged. Each of batteries B1, B2 is, for example, a secondary battery such as a nickel hydrogen battery or a lithium ion battery. Batteries B1, B2 output generated dc voltage to boosting converters 11, 12 respectively. Batteries B1, B2 are charged by dc voltage output from boosting converters 11, 12 respectively.

Boosting converter 11 includes a reactor L1, IGBT devices Q1, Q2, and diodes D1, D2. Reactor L1 has one end connected to power line PL1, and has the other end connected to the connection point of IGBT devices Q1, Q2. IGBT devices Q1, Q2 are connected in series between power line PL2 and ground line SL, and receive at their gate electrodes a control signal PWC1 from control device 60. Diodes D1, D2 are connected between the collectors and emitters of IGBT devices Q1, Q2 to pass current from their emitter sides to their collector sides, respectively.

Boosting converter 12 includes a reactor L2, IGBT devices Q3, Q4, and diodes D3, D4. Reactor L2 has one end connected to power line PL3, and has the other end connected to the connection point of IGBT devices Q3, Q4. IGBT devices Q3, Q4 are connected in series between power line PL3 and ground line SL, and receive at their gate electrodes a control signal PWC2 from control device 60. Diodes D3, D4 are connected between the collectors and emitters of IGBT devices Q3, Q4 to pass current from their emitter sides to their collector sides, respectively.

Inverter 20 includes a U phase arm 21, a V phase arm 22, and a W phase arm 23. U phase arm 21, V phase arm 22, and W phase arm 23 are connected in parallel between power line PL2 and ground line SL. U phase arm 21 is constituted by IGBT devices Q11, Q12 connected in series, V phase arm 22 is constituted by IGBT devices Q13, Q14 connected in series, and W phase arm 23 is constituted by IGBT devices Q15, Q16 connected in series. IGBT devices Q11-Q16 have collectors and emitters between which diodes D11-D16 are connected to pass current from their emitter sides to their collector sides, respectively.

The connection points of the IGBT devices in the phase arms are connected via U, V, W phase lines UL1, VL1, WL1 to motor generator MG1 at the sides opposite to the neutral point of its U, V, W phase coils, respectively.

Inverter 30 includes a U phase arm 31, a V phase arm 32, and a W phase arm 33. U phase arm 31, V phase arm 32, and W phase arm 33 are connected in parallel between power line PL2 and ground line SL. U phase arm 31 is constituted by IGBT devices Q21, Q22 connected in series, V phase arm 32 is constituted by IGBT devices Q23, Q24 connected in series, and W phase arm 33 is constituted by IGBT devices Q25, Q26 connected in series. IGBT devices Q21-Q26 have collectors and emitters between which diodes D21-D26 are connected to pass current from their emitter sides to their collector sides, respectively.

Also in inverter 30, the connection points of the IGBT devices in the phase arms are connected via U, V, W phase lines UL2, VL2, WL2 to motor generator MG2 at the sides opposite to the neutral point of its U, V, W phase coils, respectively.

Capacitor C11 is connected between power line PL1 and ground line SL to reduce influence, resulting from voltage variation, over battery B1 and boosting converter 11. Capacitor C12 is connected between power line PL3 and ground line SL to reduce influence, resulting from voltage variation, over battery B2 and boosting converter 12. Capacitor C2 is connected between power line PL2 and ground line SL to reduce influence, resulting from voltage variation, over inverters 20, 30, and boosting converters 11, 12.

Boosting converter 11 boosts dc voltage from battery B 1 based on control signal PWC1 from control device 60 by accumulating, in reactor L1 as magnetic field energy, current flowing according to a switching operation of IGBT device Q2, and outputs the boosted voltage to power line PL2 via diode D1 in synchronism with a timing at which IGBT device Q2 is turned off. Also based on control signal PWC1 from control device 60, boosting converter 11 steps down dc voltage received from inverter(s) 20 and/or 30 via power line PL2, to the voltage level of battery B1 to charge battery B1.

Boosting converter 12 carries out an operation similar to that performed by boosting converter 11, based on control signal PWC2 from control device 60. In this way, dc voltage from battery B2 is boosted and output to power line PL2. Also based on control signal PWC2, boosting converter 12 steps down dc voltage received from inverter(s) 20 and/or 30 via power line PL2, to the voltage level of battery B2 to charge battery B2.

Inverter 20 converts dc voltage received from power line PL2 into ac voltage, based on a control signal PWM1 from control device 60, and outputs it to motor generator MG1. Thus, motor generator MG1 is driven to generate desired torque. Also based on control signal PWM1 from control device 60, inverter 20 converts ac voltage generated by motor generator MG1 into dc voltage, and outputs the converted dc voltage to power line PL2.

Inverter 30 converts dc voltage received from power line PL2 into ac voltage, based on a control signal PWM2 from control device 60, and outputs it to motor generator MG2. Thus, motor generator MG2 is driven to generate desired torque. Also based on control signal PWM2 from control device 60, upon regenerative braking of motor generator MG2, inverter 30 converts ac voltage output from motor generator MG2 into dc voltage, and outputs the converted dc voltage to power line PL2.

To connector 50, power lines PL31, PL32 are connected. According to a signal EN from control device 60, AC port 40 connects and disconnects AC lines ACL1, ACL2 to and from power lines PL31, PL32, respectively. By connecting connector 50 to connector 204 of FIG. 1, ac voltage Vac is obtained in power lines PL31, PL32. When AC lines ACL1, ACL2 and power lines PL31, PL32 are respectively connected to each other, ac current Iac flows in AC line ACL1. AC port 40 detects ac voltage Vac and ac current Iac, and outputs the detection result to control device 60.

AC line ACL1 is connected to the neutral point N1 of motor generator MG1, whereas AC line ACL 2 is connected to the neutral point N2 of motor generator MG2. When the vehicle is stopped and power storage device B is to be charged, control device 60 outputs signal EN to AC port 40 to connect AC lines ACL1, ACL2 to power lines PL31, PL32 respectively. Moreover, control device 60 controls inverters 20, 30 to convert ac voltage Vac between neutral points N1, N2 into dc voltage. Furthermore, control device 60 controls boosting converter 11, 12 to convert dc voltage supplied from inverters 20, 30 into voltage suitable for charging batteries B1, B2. With the converted voltage, batteries B1, B2 are charged.

Specifically, control device 60 generates control signals PWC1, PWC2 for driving boosting converters 11, 12, based on a torque command value and motor rotation speed of each motor generator MG1, MG2, battery voltage of each battery B1, B2, and voltage in each power line PL2, PL3. Control device 60 outputs control signals PWC1, PWC2 to boosting converters 11, 12 respectively. Note that the rotation speed of each motor generator MG1, MG2, the voltage of each battery B1, B2, and the voltage in each power line PL2, PL3 are detected by sensors (not shown).

Further, control device 60 generates control signal PWM1 for driving motor generator MG1, based on the voltage in power line PL2 and the motor current and torque command value of motor generator MG1. Furthermore, control device 60 generates control signal PWM2 for driving motor generator MG2, based on the voltage in power line PL2 and the motor current and torque command value of motor generator MG2.

Note that there may be provided a relay circuit for connecting the positive electrode and negative electrode of battery B1 to power line PL1 and ground line SL respectively, and may be provided a relay circuit for connecting the positive electrode and negative electrode of battery B2 to power line PL3 and ground line SL respectively.

Figure 3:
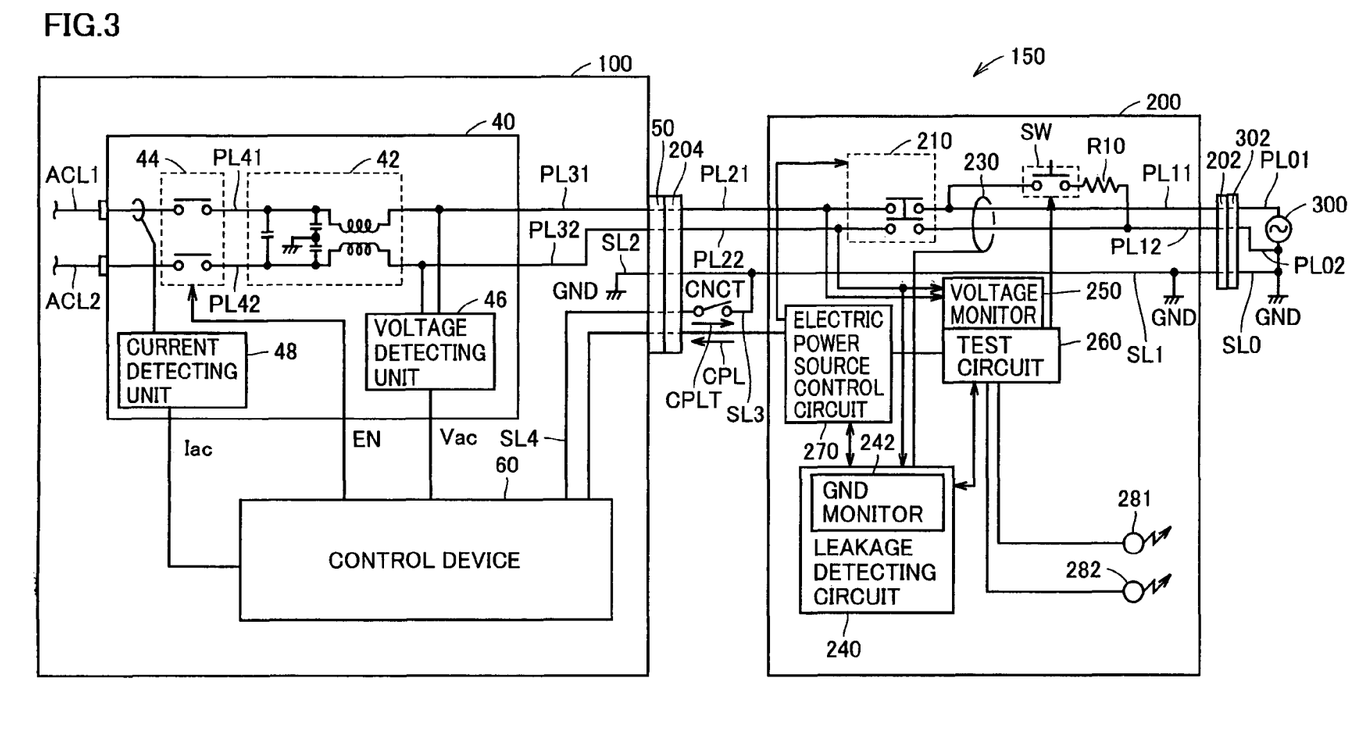
FIG. 3 illustrates configurations of an AC port 40 of FIG. 2 and a charging device 150 of FIG. 1.

FIG. 3 illustrates the configurations of AC port 40 of FIG. 2 and charging device 150 of FIG. 1. Referring to FIG. 3, AC port 40 includes an LC filter 42, a connecting circuit 44, power lines PL41, PL42, a voltage detecting unit 46, and a current detecting unit 48.

LC filter 42 removes high frequency noise from ac voltage obtained between power lines PL31, PL32. The ac voltage from which the high frequency noise has been removed is output to each of power lines PL41, PL42. Connecting circuit 44 is turned on/off according to signal EN sent from control device 60. In the on state, connecting circuit 44 connects power line PL41 to AC line ACL1, and connects power line PL42 to AC line ACL2. Connecting circuit 44 is a connecting circuit for electrically connecting and disconnecting power storage device B to and from the electric power supply path.

Voltage detecting unit 46 detects ac voltage Vac between power lines PL31, PL32, and outputs the detection result to control device 60. Current detecting unit 48 detects ac current Iac flowing in AC line ACL1 and outputs the detection result to control device 60. Note that current detecting unit 48 may detect current flowing in AC line ACL2.

Charging device 150 includes connectors 202, 204, power lines PL11, PL12, PL21, PL22, ground lines SL1-SL3, a switch CNCT, and a charge control device 200.

Ground line SL1 is connected to ground line SL0 via connectors 202, 302. Ground line SL0 is connected to power line PL02 of ac electric power source 300 and to a ground node (denoted as GND in the figure). Thus, ground line SL1 is grounded, too. Note that the voltage in power line PL01 varies on the basis of the voltage in ground line SL0 (power line PL02).

Further, ground line SL1 is connected to ground line SL2 in electrical device 100 via connector 204, 50. Thus, ground line SL2 is grounded, too.

Ground line SL3 connects one end of switch CNCT to ground line SL1. The other end of switch CNCT is electrically connected to ground line SL4 of electrical device 100 via connectors 204, 50.

Charge control device 200 includes a switch SW, a resistor R10, a ZCT (zero-phase-sequence current transformer) 230, leakage detecting circuit 240, a voltage monitor 250, test circuit 260, an electric power source control circuit 270, an AC conduction lamp 281, and an abnormality lamp 282.

Switch SW and resistor R10 are connected in series between power line PL11 and power line PL12. ZCT 230 is provided to surround power lines PL11, PL12. When electrical leakage occurs somewhere in the electric power supply path including power lines PL11, PL12, PL21, PL22, unbalance current flows in the output side of ZCT 230. This unbalance current is detected by leakage detecting circuit 240.

Leakage detecting circuit 240 includes a GND (ground) voltage monitor 242 for monitoring voltage (ground voltage) of power line PL22. Based on the respective detection results of ZCT 230 and GND voltage monitor 242, leakage detecting circuit 240 detects the occurrence of electrical leakage in the electric power supply path. For example, leakage detecting circuit 240 determines that there is electrical leakage if the level of the unbalance current is equal to or higher than a predetermined value.

Voltage monitor 250 monitors voltage between power lines PL21, PL22, and outputs the monitoring result (voltage value) to test circuit 260. Test circuit 260 instructs electric power source control circuit 270 to turn on/off relay unit 210 during examination for relay unit 210. In accordance with the instruction from test circuit 260, electric power source control circuit 270 turns on/off relay unit 210.

During the examination for leakage detecting circuit 240, test circuit 260 brings switch SW into the on state. Turning on switch SW develops a short circuit of power lines PL11, PL12. This causes unbalance current to flow in the output side of ZCT 230, so leakage detecting circuit 240 determines that there is electrical leakage.

When test circuit 260 receives from leakage detecting circuit 240 a signal indicating that electrical leakage has been detected, it determines that leakage detecting circuit 240 is normal. After completing the examination for leakage detecting circuit 240, test circuit 260 turns off switch SW.

If the voltage value received from voltage monitor 250 at the start of charging electrical device 100 indicates, for example, AC 100V, test circuit 260 determines that relay unit 210 has been turned on. In this case, test circuit 260 causes AC conduction lamp 281 to illuminate. AC conduction lamp 281 illuminates in, for example, green.

If test circuit 260 determines, based on the voltage value received from voltage monitor 250, that there is a problem with relay unit 210 (the contact is welded), it causes abnormality lamp 282 to illuminate. Abnormality lamp 282 illuminates in, for example, red.

During examination for relay unit 210, electric power source control circuit 270 turns on/off relay unit 210 in accordance with the instruction from test circuit 260. Note that the examination period for relay unit 210 is included in the non-charging period of power storage device B. As such, electric power source control circuit 270 is a control circuit that causes relay unit 210 to interrupt the electric power supply path while power storage device B is not being charged.

Further, electric power source control circuit 270 generates a signal CPL indicating the voltage and current capacity of ac electric power source 300, and outputs signal CPL to control device 60. For example, the duty ratio of signal CPL indicates the current capacity, and the peak value of signal CPL indicates the voltage. Based on the information regarding the current capacity and voltage contained in signal CPL, control device 60 controls electric power converting unit 10 to appropriately charge power storage device B.

Switch CNCT is brought into the on state by connecting connector 204 to connector 50, and is brought into the off state by disconnecting connector 204 from connector 50. When switch CNCT is brought into the on state, ground line SL4 is connected to ground line SL3. Thus, ground line SL4 is grounded.

By detecting the voltage in ground line SL4, control device 60 detects that connector 204 is connected to connector 50. When control device 60 detects that connector 204 is connected to connector 50, it determines whether or not the detection result obtained from voltage detecting unit 46 indicates a voltage obtained when the electric power supply path is interrupted.

If control device 60 determines that the detection result indicates the voltage obtained when the electric power supply path is interrupted, it changes the level of signal CPLT from the L (logic low) level to the H (logic high) level to bring relay unit 210 into the on state (end the interruption of the electric power supply path). When signal CPLT is at the H level, electric power source control circuit 270 turns on relay unit 210, whereas when signal CPLT is at the L level, it turns off relay unit 210. Note that relay unit 210 may be turned on when signal CPLT is at L level, whereas relay unit 210 may be turned off when signal CPLT is at the H level.

Further, control device 60 turns on connecting circuit 44. This causes power storage device B to be connected to the electric power supply path. Note that during non-charging period of power storage device B, control device 60 sets connecting circuit 44 at the off state. If connecting circuit 44 is turned on with the contact of relay unit 210 welded, there may be an influence over inverters 20, 30. The influence over inverters 20, 30 may be extended to power storage device B. However, as described above, control device 60 confirms that relay unit 210 has been off (the voltage of the electric power supply path indicates the voltage obtained when the electric power supply path is interrupted), and then starts charging of power storage device B (turns on connecting circuit 44). In this way, such a problem can be prevented.

Figure 4:
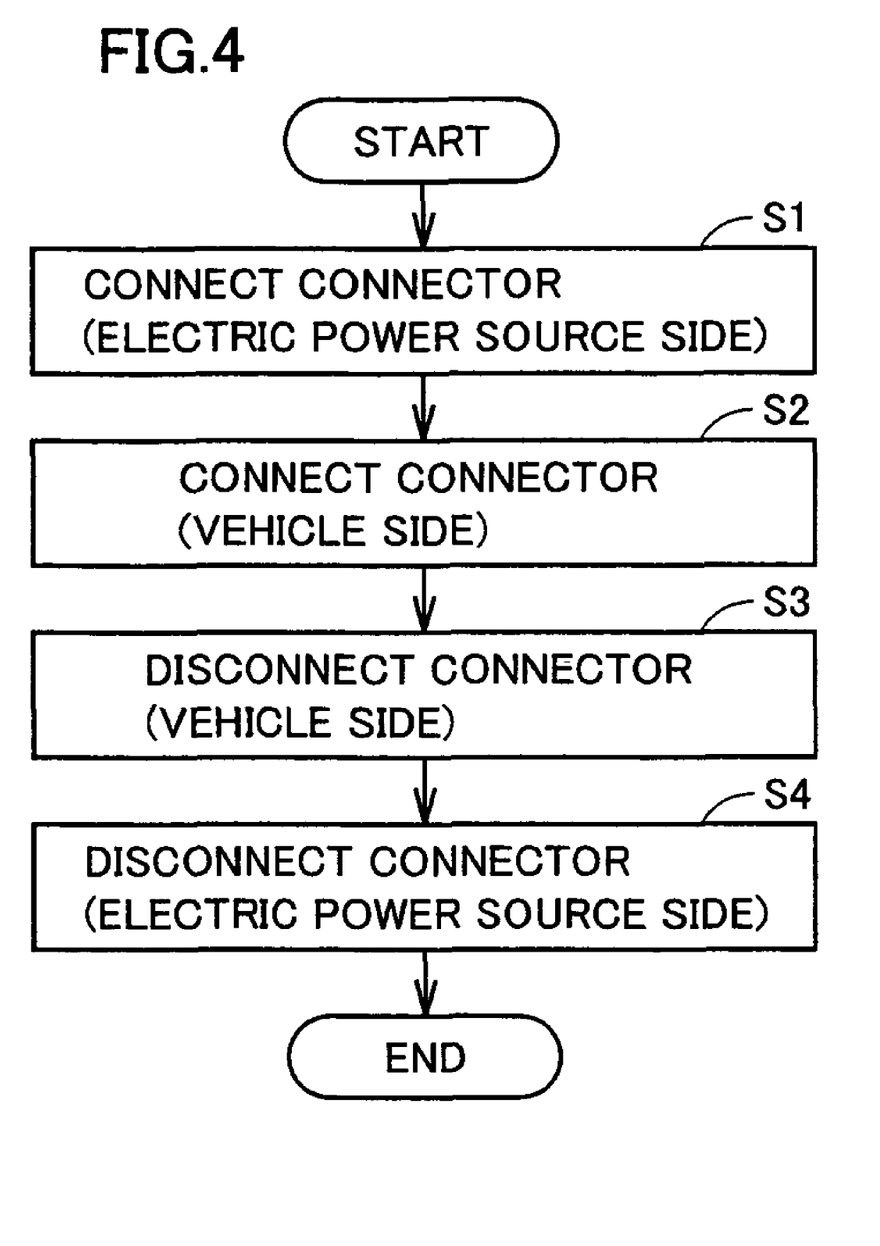
FIG. 4 is a flowchart illustrating a user's charging operation onto electrical device 100.

FIG. 4 is a flowchart illustrating the user's charging operation onto electrical device 100. Referring to FIG. 4 and FIG. 3, the user connects connector 202 to connector 302 of ac electric power source 300 (step S1). Then, the user connects connector 204 to connector 50 of electrical device 100 (vehicle) (step S2). In this way, charging of electrical device 100 is started. When the charging of electrical device 100 is completed, the user disconnects connector 204 from connector 50 of the vehicle side (step S3) and then disconnects connector 202 from connector 302 of ac electric power source 300 (step S4). Note that the processes of steps S1, S2 may be performed in reverse order. Likewise, the processes of steps S3, S4 may be performed in reverse order.

Figure 5:
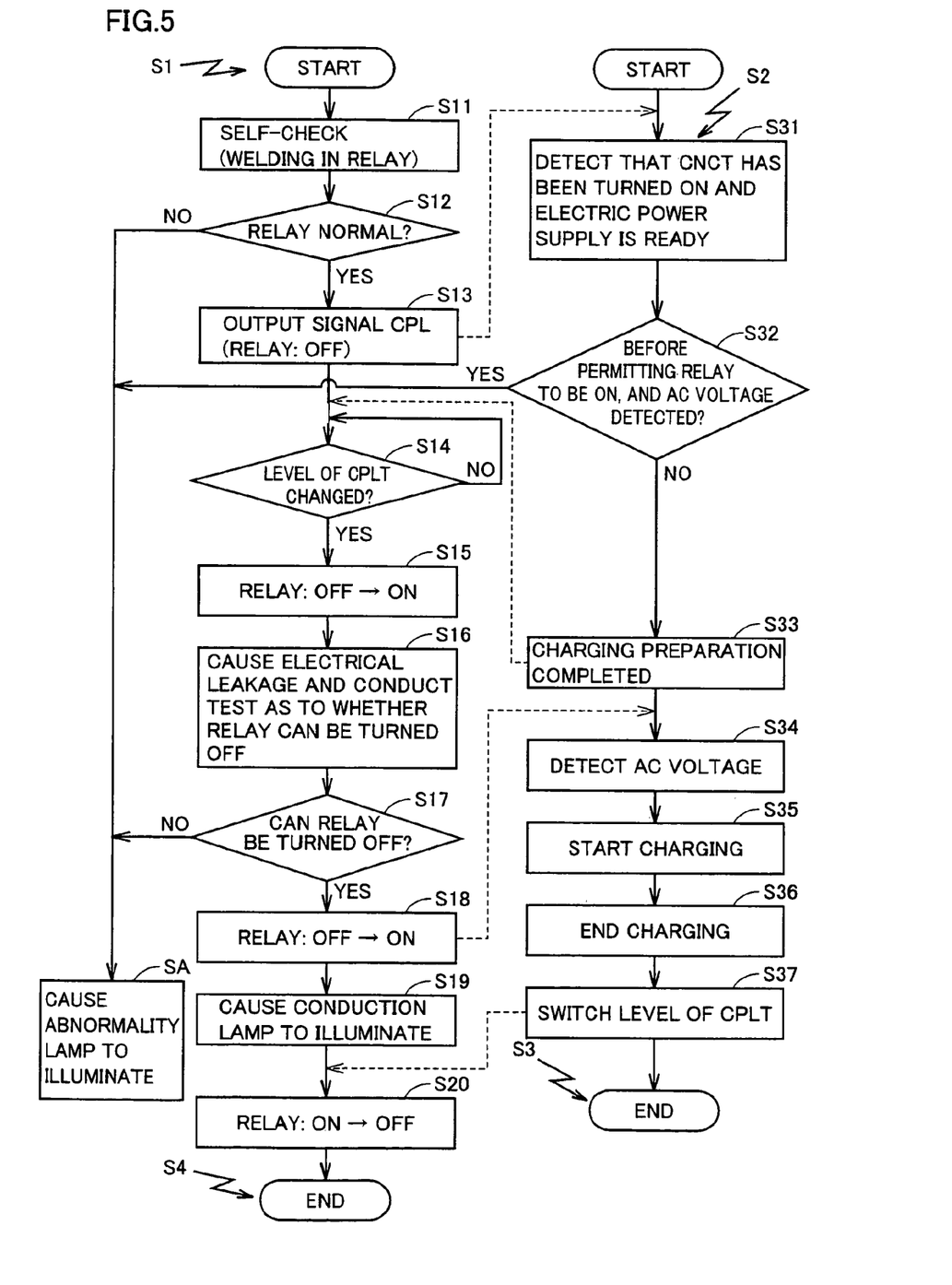
FIG. 5 is a flowchart illustrating processes of charge control device 200 and electrical device 100 each performed in accordance with the user's charging operation shown in FIG. 4.

FIG. 5 is a flowchart illustrating respective processes of charge control device 200 and electrical device 100 each performed in accordance with the user's charging operation shown in FIG. 4. Referring to FIG. 5 and FIG. 3, charge control device 200 performs processes of steps S11-S20. Electrical device 100 performs processes of steps S31-S37.

When connector 202 is connected to connector 302 in step S1 (see FIG. 4), voltage is supplied from ac electric power source 300 to charge control device 200. This voltage supply triggers charge control device 200 to operate. First, test circuit 260 obtains a voltage value from voltage monitor 250. Based on the voltage value, test circuit 260 performs self-checking as to whether or not the contact of the relay unit is welded (step S11).

For example, if relay unit 210 is normal (the contact is not welded), the voltage value indicates AC 0V. If the contact of relay unit 210 is welded, the voltage value indicates AC 100V. Thus, based on the voltage value, test circuit 260 can determine whether or not relay unit 210 is normal.

From the result of the self-checking, test circuit 260 determines whether or not relay unit 210 is normal (step S12). If relay unit 210 is not normal (NO in step S12), test circuit 260 causes abnormality lamp 282 to illuminate (step SA). If relay unit 210 is normal (YES in step S12), test circuit 260 instructs electric power source control circuit 270 to output a signal CPL. In accordance with the instruction from test circuit 260, electric power source control circuit 270 generates signal CPL indicating the current capacity and voltage of ac electric power source 300, and outputs it. Further, test circuit 260 causes electric power source control circuit 270 to turn off relay unit 210 (step S13).

On the other hand, in electrical device 100, control device 60 monitors voltage in ground line SL4. When connector 204 is connected to connector 50 in step S2 (see FIG. 4), the voltage of ground line SL4 is brought to the ground voltage level. From this, control device 60 detects that switch CNCT has been turned on. Further, control device 60 receives signal CPL from electric power source control circuit 270 to obtain the information regarding ac electric power to be supplied to electrical device 100. In this way, control device 60 detects that electric power supply to electrical device 100 is ready (step S31).

Following the process of step S31, control device 60 determines whether or not the process has currently proceeded to a point before permitting relay unit 210 to be on (switching signal CPLT from the L level to the H level) and whether or not voltage detecting unit 46 has detected an ac voltage (ac voltage Vac) of, for example, 100V (step S32).

If control device 60 has not yet permitted relay unit 210 to be on but voltage detecting unit 46 detects a voltage value of AC 100V, the contact of relay unit 210 is highly likely to be welded. In this case (YES in step S32), control device 60 sends to test circuit 260 information indicating that there is welding in relay unit 210, and test circuit 260, having received this information, causes abnormality lamp 282 to illuminate (step SA). Note that test circuit 260 may determine from the detection result of voltage monitor 250 that relay unit 210 has been welded. Based on the information from control device 60 or voltage monitor 250, test circuit 260 examines the interruption of the electric power supply path caused by relay unit 210.

On the other hand, if control device 60 has not yet permitted relay unit 210 to be on and the voltage value is 0V (NO in step S32), control device 60 determines that relay unit 210 is off. In this case, control device 60 controls electric power converting unit 10 to complete preparation for charging power storage device B (step S33). Once the preparation for charging has been completed, control device 60 switches the level of signal CPLT from the L level to the H level, to cause electric power source control circuit 270 to turn on relay unit 210.

In charge control device 200, electric power source control circuit 270 determines whether or not the level of signal CPLT received from control device 60 has been changed from the L level to the H level (step S14). If the level of signal CPLT is unchanged and remains at the L level (NO in step S14), the determination process of step S14 will be repeated. When the level of signal CPLT is changed from the L level to the H level (YES in step S14), electric power source control circuit 270 switches relay unit 210 from the off state to the on state (step S15).

Then, test circuit 260 turns on switch SW to cause electrical leakage in the electric power supply path. Further, test circuit 260 performs test as to whether or not relay unit 210 can be turned off upon occurrence of electrical leakage (step S16).

If leakage detecting circuit 240 is normal, leakage detecting circuit 240 detects the electrical leakage and outputs the detection result to test circuit 260. From this, test circuit 260 examines whether or not leakage detecting circuit 240 is normal. If leakage detecting circuit 240 is normal, test circuit 260 causes electric power source control circuit 270 to turn off relay unit 210.

In step S17, test circuit 260 determines whether or not relay unit 210 can be turned off upon occurrence of electrical leakage. If relay unit 210 cannot be turned off upon occurrence of electrical leakage (NO in step S17), test circuit 260 turns off switch SW. Also, test circuit 260 causes abnormality lamp 282 to illuminate (step SA).

As long as leakage detecting circuit 240 and relay unit 210 operate normally in step S16, relay unit 210 is in the off state. In this case (YES in step S17), test circuit 260 turns off switch SW and instructs electric power source control circuit 270 to turn on relay unit 210. In response, electric power source control circuit 270 switches relay unit 210 from the off state to the on state (step S18). When relay unit 210 is turned on, test circuit 260 causes AC conduction lamp 281 to illuminate (step S19).

When relay unit 210 is turned on in step S18, voltage detecting unit 46 detects ac voltage (for example AC 100V) (step S34). Then, control device 60 controls electric power converting unit 10 to start charging of power storage device B (step S35).

When a predetermined charging end condition is satisfied, control device 60 ends the charging of power storage device B (step S36). This condition is satisfied when, for example, both the voltage values of batteries B1, B2 reach or exceed a predetermined value. Then, control device 60 switches the level of signal CPLT from the H level to the L level to turn off relay unit 210 (step S37).

In charge control device 200, electric power source control circuit 270 detects the switching of the level of signal CPLT. Accordingly, electric power source control circuit 270 switches relay unit 210 from the on state to the off state (step S20). When the user disconnects connector 204 from connector 50 in step S3 (see FIG. 4), the charging process in electrical device 100 is terminated. When the user disconnects connector 202 from connector 302 in step S4 (see FIG. 4), the process in charge control device 200 is terminated.

In this way, in the present embodiment, test circuit 260 first examines the normality of relay unit 210, and then examines the operation of leakage detecting circuit 240. This allows relay unit 210 to interrupt the electric power supply path more securely, if electrical leakage occurs in the electric power supply path including power lines PL11, PL12, PL21, PL22. Thus, according to the present embodiment, the charging operation can be performed smoothly.

Further, in the present embodiment, if the welding of the contact of relay unit 210 is detected before starting charging of power storage device B, control device 60 does not allow the charging of power storage device B (maintains connecting circuit 44 in the off state). This can prevent a problem from occurring in electric power converting unit 10 and power storage device B. Thus, the user's charging operation can also be prevented from being influenced. As such, according to the present embodiment, the user's charging operation can be performed smoothly.

Note that in the present embodiment, electrical device 100 is installed in a hybrid vehicle. However, in the present invention, electrical device 100 may be installed in an electric vehicle or a fuel cell vehicle.

It should be understood that the embodiments disclosed herein are illustrative and non-restrictive in any respect. The scope of the present invention is defined by the terms of the claims, rather than the description above, and is intended to include any modifications within the scope and meaning equivalent to the terms of the claims.

The invention claimed is:

1. A charging device provided between a chargeable electrical device and an electric power source for supplying charging electric power to said electrical device, comprising:
   an electric power supply path for supplying said charging electric power from said electric power source to said electrical device;
   an interrupting circuit configured to be operable to interrupt said electric power supply path;
   a leakage detecting circuit for detecting electrical leakage occurring in said electric power supply path; and
   an examining circuit for detecting the interruption of said electric power supply path caused by said interrupting circuit and for examining said leakage detecting circuit after confirming the interruption of said electric power supply path caused by said interrupting circuit.

2. A charging system, comprising:
   an electrical device including a chargeable power storage device; and
   a charging device for charging said power storage device by supplying charging electric power from an electric power source to said power storage device,
   said charging device, including:
   an electric power supply path for supplying said charging electric power from said electric power source to said electrical device;
   an interrupting circuit configured to be operable to interrupt said electric power supply path;
   a leakage detecting circuit for detecting electrical leakage occurring in said electric power supply path; and
   an examining circuit for detecting the interruption of said electric power supply path caused by said interrupting circuit and for examining said leakage detecting circuit after confirming the interruption of said electric power supply path caused by said interrupting circuit.

3. The charging system according to claim 2, wherein:
   said charging device further includes a first control circuit for causing said interrupting circuit to interrupt said electric power supply path during a non-charging period of said power storage device,
   said interrupting circuit is operable to end the interruption of said electric power supply path, and
   said electrical device further includes:
   a connecting circuit for electrically connecting and disconnecting said power storage device to and from said electric power supply path; and
   a second control circuit for setting said connecting circuit at a disconnection state during the non-charging period of said power storage device, and for causing said interrupting circuit to end the interruption of said electric power supply path and setting said connecting circuit at a connection state, during a charging period of said power storage device in a case where said second control circuit determines that said electric power supply path has a voltage indicating a voltage obtained when said electric power supply path is interrupted.

4. The charging system according to claim 3, wherein said electrical device is installed in a vehicle and outputs motive power of said vehicle.

* * * * *